US011316025B2

(12) United States Patent
Fiorenza et al.

(10) Patent No.: US 11,316,025 B2
(45) Date of Patent: Apr. 26, 2022

(54) SILICON CARBIDE-BASED ELECTRONIC DEVICE AND METHOD OF MANUFACTURING THE SAME

(71) Applicant: STMICROELECTRONICS S.r.l., Agrate Brianza (IT)

(72) Inventors: Patrick Fiorenza, Belpasso (IT); Fabrizio Roccaforte, Mascalucia (IT); Mario Giuseppe Saggio, Aci Bonaccorsi (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/882,293

(22) Filed: May 22, 2020

(65) Prior Publication Data

US 2020/0373398 A1  Nov. 26, 2020

(30) Foreign Application Priority Data

May 24, 2019 (IT) .................. 102019000007217

(51) Int. Cl.
*H01L 29/16* (2006.01)
*H01L 29/872* (2006.01)
(Continued)

(52) U.S. Cl.
CPC ...... *H01L 29/4234* (2013.01); *H01L 27/0629* (2013.01); *H01L 29/1608* (2013.01); *H01L 29/872* (2013.01)

(58) Field of Classification Search
CPC ..... H01L 29/16; H01L 29/1608; H01L 29/42; H01L 29/423; H01L 29/4234;
(Continued)

(56) References Cited

U.S. PATENT DOCUMENTS 4,542,400 A * 9/1985 Hiraki ............... H01L 21/31
257/637
5,900,648 A  5/1999 Harris et al.
(Continued)

FOREIGN PATENT DOCUMENTS

JP  2016-195225 A  11/2016

OTHER PUBLICATIONS

Afanas'ev et al., "Band alignment and defect states at SiC/oxide interfaces," *J. Phys.: Condens. Matter* 16:S1839-S1856, 2004.
(Continued)

*Primary Examiner* — Monica D Harrison
(74) *Attorney, Agent, or Firm* — Seed IP Law Group LLP

(57) ABSTRACT

An electronic device comprising: a semiconductor body of silicon carbide, SiC, having a first and a second face, opposite to one another along a first direction, which presents positive-charge carriers at said first face that form a positive interface charge; a first conduction terminal, which extends at the first face of the semiconductor body; a second conduction terminal, which extends on the second face of the semiconductor body; a channel region in the semiconductor body, configured to house, in use, a flow of electrons between the first conduction terminal and the second conduction terminal; and a trapping layer, of insulating material, which extends in electrical contact with the semiconductor body at said channel region and is designed so as to present electron-trapping states that generate a negative charge such as to balance, at least in part, said positive interface charge.

20 Claims, 1 Drawing Sheet

(51) Int. Cl.
*H01L 27/06* (2006.01)
*H01L 29/423* (2006.01)

(58) Field of Classification Search
CPC ....... H01L 29/87; H01L 29/872; H01L 27/06; H01L 27/062; H01L 27/0629
USPC .......................................................... 257/76
See application file for complete search history.

(56) References Cited

U.S. PATENT DOCUMENTS

| | | | |
|---|---|---|---|
| 2003/0073270 A1* | 4/2003 | Hisada | H01L 29/7813 438/197 |
| 2012/0018798 A1 | 1/2012 | Mauder et al. | |
| 2012/0176183 A1* | 7/2012 | Tanaka | H01L 29/7838 327/534 |
| 2014/0175457 A1 | 6/2014 | Yen et al. | |
| 2018/0026131 A1 | 1/2018 | Kurosaki et al. | |

OTHER PUBLICATIONS

Bakowski et al., "Development of 3C—SiC MOSFETs," *Journal of Telecommunications and Information Technology* 2:49-56, 2007.

Cherkaoui et al., "Investigating positive oxide charge in the $SiO_2$/3C—SiC MOS system," *AIP Advances* 8(085323):2018, 8 pages.

Greco et al., "Conduction Mechanisms at Interface of AlN/SiN Dielectric Stacks with AlGaN/GaN Heterostructures for Normally-off High Electron Mobility Transistors: Correlating Device Behavior with Nanoscale Interfaces Properties," *ACS Appl. Mater. Interfaces* 9:35383-35390, 2017.

Roberts et al., "Control of threshold voltage in E-mode and D-mode GaN-on-Si metal-insulator-semiconductor heterostructure field effect transistors by in-situ fluorine doping of atomic layer deposition $Al_2O_3$ gate dielectrics," *Applied Physics Letters* 108(072901):2016, 5 pages.

Schöner et al., "Realisation of Large Area 3C—SiC MOSFETs," *Materials Science Forum* 483-455:801-804, 2005.

Uchida et al., "High Temperature Performance of 3C—SiC MOSFETs with High Channel Mobility," *Materials Science Forum* 777-720:1109-1112, 2012.

Compound Semiconductor magazine, "Meeting the need for low-cost MOSFETs," vol. 21, Issue 1, 2015, p. 41-44.

Yole Development, "SiC technologies adoption is going to accelerate with a tipping point in 2019," Aug. 2017, p. 1-4.

* cited by examiner

SILICON CARBIDE-BASED ELECTRONIC DEVICE AND METHOD OF MANUFACTURING THE SAME

BACKGROUND

Technical Field

The present disclosure relates to an electronic device, in particular a power MOSFET or a Schottky diode, and to a method for manufacturing the electronic device.

Description of the Related Art

As is known, semiconductor materials with wide band gap, in particular having a high value of the forbidden band, a low ON-state resistance (Rory), a high value of thermal conductivity, high operating frequencies and a high saturation velocity of the charge carriers, are ideal for producing electronic components, such as diodes or transistors, in particular for electrical applications. A material having said characteristics and adapted to be used for manufacturing electronic components is silicon carbide (SiC). In particular, silicon carbide, in its various polytypes (for example, 3C—SiC, 4H—SiC, 6H—SiC) is preferable to silicon as regards its properties listed previously.

The hexagonal polytype of SiC (4H—SiC) is by far the most extensively studied polytype, and currently available on the market are mass-produced 4H—SiC wafers, even though at a higher cost than typical silicon wafers. 3C—SiC has a significant cost advantage over 4H—SiC in so far as it can be grown directly on Si by CVD (Chemical-Vapor Deposition). The availability of 3C—SiC epitaxial layers of good quality on Si enables implementation of economically convenient SiC power devices, for example, adapted to operate in the range from 650 V to 1200 V.

Electronic devices provided with a silicon-carbide substrate, with respect to similar devices provided with a silicon substrate, present further advantages, such as low emission resistance in conduction mode, low leakage current, and high operating frequencies. In particular, SiC Schottky diodes have shown a higher switching performance, which renders the SiC electrical devices particularly favorable for high-frequency applications.

Numerous scientific works have moreover reported a good switching performance of (SiC) MOSFET devices in silicon-carbide. From an industrial standpoint, in addition to the switching performance, SiC MOSFET devices likewise present a good structural strength which is a desirable characteristic in power systems.

However, the presence of a fixed positive charge in MOS (Metal-Oxide-Semiconductor) structures, has been frequently observed experimentally, in which the oxide is silicon dioxide ($SiO_2$) and the semiconductor is cubic silicon carbide (3C—SiC). It has also been found that $SiO_2$ thermally grown on 3C—SiC substrates, or deposited on 3C—SiC substrates, shows levels of positive charge similar to the ones observed in MOS structures, indicating that the charge comes from interface states present at the 3C—SiC surface (at the interface between SiC and $SiO_2$) and not from the oxide.

The presence of positive charges at the oxide interface might shift the operating characteristics of the MOSFET or might affect the profiles of electrical field at the edge terminations of the device or, in extreme cases, might generate undesired inversion layers at the oxide/SiC interface, thus causing high levels of junction leakage currents. Moreover, the defects at the oxide/SiC interface create states that change the occupation with the modulation of the surface potential at the interface, and this would also appear to affect switching of the device and cause instability.

BRIEF SUMMARY

According to the present disclosure, an electronic device and a method of manufacturing the same are provided.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
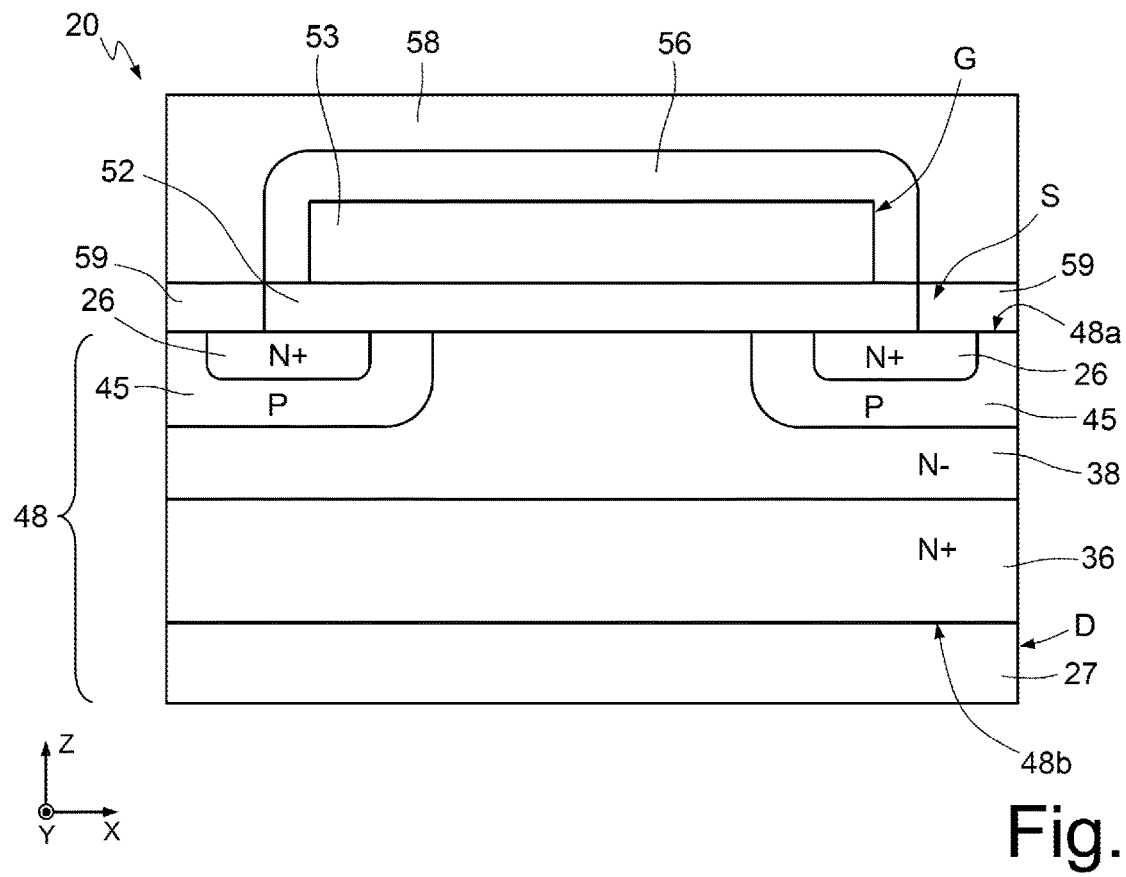
FIG. 1 illustrates, in side sectional view, a MOSFET device according to an aspect of the present disclosure.

FIG. 1 is a sectional view in a (triaxial) Cartesian reference system of axes X, Y, Z of a transistor 20, in particular a vertical-channel MOSFET, even more in particular a power MOSFET, according to an aspect of the present disclosure. The transistor 20 comprises: a gate terminal G (forming a control terminal), which can be coupled, in use, to a generator of a biasing voltage $V_{GS}$; a first conduction terminal S, including a source region 26 (implanted region of an N type) and a source metallization 59 (in electrical contact with the source region 26); and a second conduction terminal or drain terminal D (including a drain metallization 27). In use, with appropriate biasing, a conductive channel of majority carriers (here, electrons) is set up between the source region 26 and the drain metallization 27.

In greater detail, the transistor 20 comprises a semiconductor body 48, in particular of SiC, more in particular of 3C—SiC, having a first and a second face 48a, 48b opposite to one another along the direction of the axis Z. In particular, FIG. 1 illustrates a semiconductor body including a base substrate 36, on which a structural layer 38 grown epitaxially extends, having the function of drift layer. The substrate 36 has a first conductivity type, here N, and a doping level, for example, ranging between $1 \cdot 10^{18}$ $cm^{-3}$ and $5 \cdot 10^{19}$ $cm^{-3}$. The structural layer 38 has the first conductivity type, here N, and a doping level lower than that of the substrate 36, for example, ranging between $1 \cdot 10^{14}$ $cm^{-3}$ and $5 \cdot 10^{16}$ $cm^{-3}$.

According to an aspect of the present disclosure, the polytype of the semiconductor body 48 is the cubic polytype of silicon carbide or 3C—SiC. However, the present disclosure finds application also for different polytypes of silicon carbide, such as, for example, 4H—SiC.

The gate terminal G extends over the first face 48a of the semiconductor body 48, a body region 45, having a second conductivity type opposite to the first conductivity type (here, an implanted region of a P type), extends in the semiconductor body 48 (more in particular, in the structural layer 38) at (facing) the first face 48a; the source region 26, having the first conductivity type, extends in the body region 45 at (facing) the first surface 48a; the drain metallization 27 extends in a position corresponding to the second face 48b of the semiconductor body 48. The transistor 20 is therefore of a vertical-conduction type (i.e., the conductive channel extends in a main direction along the axis Z).

The gate terminal G includes an insulating or dielectric layer 52 (having the function of gate dielectric) for example, of a compound, a multilayer, or an alloy including aluminum (e.g., $Al_2O_3$, AlN, AlON). The insulating layer 52 may likewise be formed by a plurality of sublayers that form a stack, or multilayer, including the aforementioned materials (e.g., $Al_2O_3$, AlN, AlON, AlN/SiN, $Al_2O_3/HfO_2$, $SiO_2/Al_2O_3/SiO_2$).

Other materials that may be used to form the insulating layer 52, include NiO, $CeO_2$, $HfO_2$, SiN, and $SiO_2/HfO_2/SiO_2$.

The insulating layer 52 has a thickness comprised, measured along the axis Z, between 10 nm and 100 nm.

The gate terminal G also includes a gate metallization 53, which extends over the insulating layer 52.

An insulating or dielectric layer 56 extends over the gate region 24 and is, in particular, of silicon dioxide ($SiO_2$) or silicon nitride (SiN) with a thickness comprised, measured along the axis Z, between 0.5 μm and 1.5 μm. Moreover, extending in the proximity of the insulating layer 56 is a source terminal 58, in particular, of metal material, for example, aluminum, with a thickness comprised, measured along the axis Z, between 0.5 μm and 2 μm.

The source terminal 58 extends until it contacts the source region 26, or is connected to the source region 26 through the source metallization 59, also known as an optional ohmic-contact region 59.

Extending on the second face 48b of the semiconductor body 48 is the metal layer 27, for example, of Ti/Ni/Au, which forms the drain terminal D. An interface layer for favoring ohmic contact, not illustrated, for example, of nickel silicide, may be present between the semiconductor body 48 and the metal layer 27.

The insulating layer 52 is designed so as to present a high density of traps for electrons. Electronic traps are known to be present in a wide range of insulating materials, both following upon the process of deposition and as a consequence of one or more treatments applied to the insulating layer 52 after its deposition.

For instance, by depositing $Al_2O_3$ by an ALD (Atomic-Layer Deposition) process or a CVD (Chemical Vapor Deposition) process, an amorphous insulating layer is obtained, in which the atoms have a co-ordination that departs from the configuration of an ideal crystal. In an embodiment provided by way of non-limiting example, the ALD/CVD process is carried out in a growth/deposition chamber at a temperature of approximately 250° C. in oxygen plasma, with TMA (trimethyl aluminum) as aluminum precursor.

In these conditions, the presence of defects in the structure (such as, in particular, oxygen holes) means that the deposited material is provided with electron traps.

Further specific treatments, as has been said, can favor formation of electron traps. Such treatments include:

a. thermal annealing treatment in a reducing environment, to increase the oxygen holes (e.g., in a chamber with a gas chosen from among $N_2$, Ar, and $NH_3$);

b. application of a voltage (e.g., a positive voltage) to the insulating layer 52 adapted to favor an accumulation of electrons in the insulating layer; and c. doping in-situ, via the introduction of electro-negative atomic species (e.g., fluorine) during the step of deposition or growth of the insulating layer 52.

The negative charges that present in the insulating layer 52, as a consequence of what has been discussed above, compensate for the ionized donors, which have an opposite (positive) charge, that are provided by the SiC semiconductor body 48, in particular as regards 3C—SiC. A MOSFET device is thus obtained having a positive threshold voltage Vth. In fact, the intrinsic properties of 3C—SiC, which are per se known, envisage formation of a positive charge at the interface with the insulator.

Figure 2:
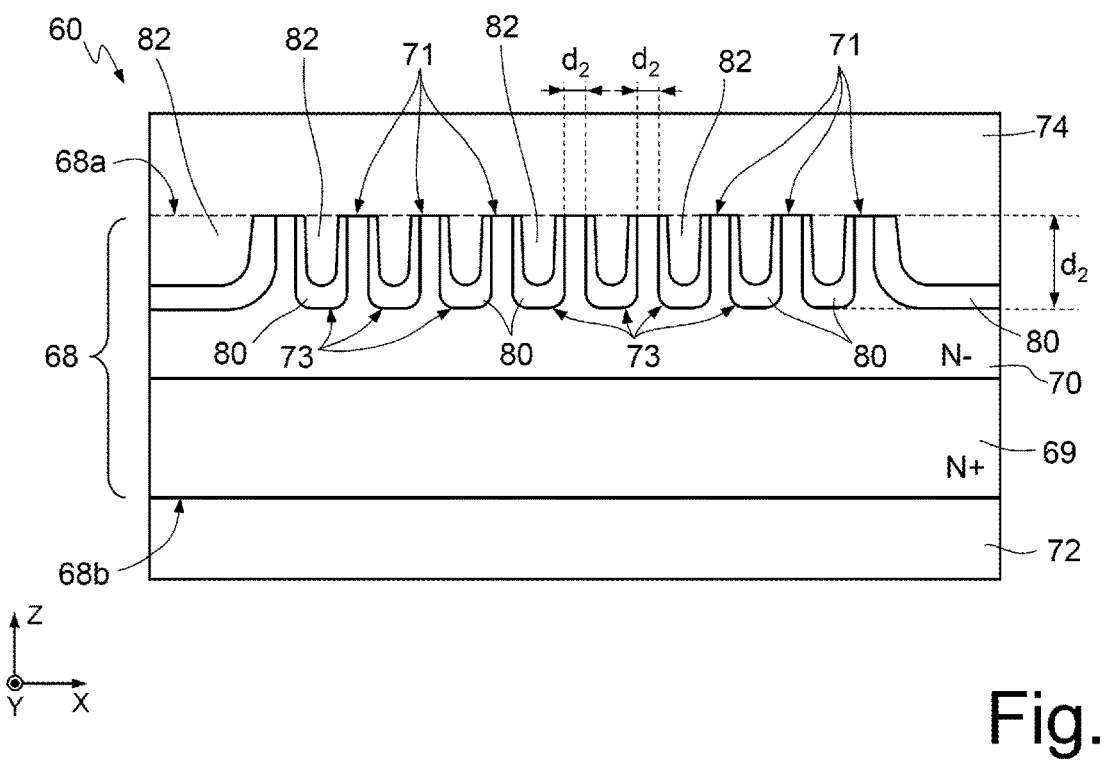
FIG. 2 illustrates, in side sectional view, a Schottky diode according to a further aspect of the present disclosure.

FIG. 2 shows a side sectional view, in a (triaxial) Cartesian reference system of axes X, Y, Z, of a Schottky (diode) device 60.

The Schottky device 60 includes a semiconductor body 68, in particular of SiC, more in particular of 3C—SiC; however, what has been described here also applies to other SiC polytypes, for example, 4H—SiC. The semiconductor body 68 has a first and a second face 68a, 68b opposite to one another along the direction of the axis Z. FIG. 2 illustrates, according to an embodiment, a semiconductor body 68 including a base substrate 69, extending on which is a structural layer 70 grown epitaxially, having the function of drift layer. The substrate 69 has a first conductivity type, here N, and a doping level comprised, for example, between $1 \cdot 10^{18}$ $cm^{-3}$ and $5 \cdot 10^{19}$ $cm^{-3}$. The structural layer 70 has the first conductivity type and a doping level lower than that of the substrate 69, for example, comprised between $1 \cdot 10^{14}$ $cm^{-3}$ and $1 \cdot 10^{17}$ $cm^{-3}$.

The Schottky device 60 moreover includes a cathode terminal 72, of metal material, which extends over the second face 68b of the semiconductor body 68; and an anode terminal 74, of metal material, which extends over the first face 68a of the semiconductor body 68. In use, by appropriate biasing, a conductive channel is set up between the anode terminal and the cathode terminal.

The Schottky device 60 has one or more trenches 73, which extend in depth in the semiconductor body 68, in particular in the drift layer 70, along a main direction parallel to the axis Z. By way of example, each trench 73 has a depth d1, measured starting from the first face 68a towards the second face 68b, having a value comprised between 100 nm and 1000 nm. In the case where several trenches 73 are present, each trench 73 is spaced at a distance from an immediately adjacent trench 73, along the direction of the axis X, by a portion of the structural layer 70. This portion of the structural layer 70 has an extension d2, along the direction of the axis X, having a value comprised, for example, between 100 nm and 5000 nm.

Each trench 73 is partially filled by an insulating layer 80, which coats the side walls and the bottom of each respective trench 73. Moreover, filling of each trench 73 is completed by portions 82 of the anode terminal 74 that penetrate and/or coat the trenches 73. Each of the portions 82 is therefore insulated from the structural layer 70 by a respective insulating layer 80.

The material chosen for the insulating layer 80 is of the same type as that of the insulating layer 52 described previously. Moreover, the insulating layer 80 is designed in a way similar to what has been described with reference to the insulating layer 52, i.e., so as to present a high number of traps for the majority carriers (here, electrons).

The insulating layer 80 can therefore be manufactured in a way similar to what has been described previously with reference to the insulating layer 52 in order to obtain the desired characteristics in terms of presence of electron traps.

Schottky junctions 71 are formed by the plurality of metal-semiconductor junctions present at the interface between the drift layer 70 and the metal layer of the anode metallization 74. In particular, the Schottky (semiconductor-metal) junctions 71 are formed by portions of the drift layer 70 (doping of an N type) in direct electrical contact with respective portions of the anode metallization 74.

The presence of a net negative charge at the insulating layer 80 enables balancing of the positive charges at the interface with the structural layer 70 and thus enables optimization of the characteristics of inhibition of the diode 60. In particular, it is possible to optimize the surface depletion layer by modifying both the ON voltage of the diode and the characteristics of inhibition for negative biasings on the Schottky contact.

In general, the present disclosure applies to a generic electronic device comprising: a semiconductor body of silicon carbide, SiC, having a first and a second face, opposite to one another along a first direction (Z), which presents positive-charge carriers at said first face that form a positive interface charge; a first conduction terminal, which extends at the first face of the semiconductor body; a second conduction terminal, which extends at the second face of the semiconductor body; a channel region in the semiconductor body, configured to house, in use, a flow of electrons between the first conduction terminal and the second conduction terminal; a trapping layer, of insulating material, extends in electrical contact with the semiconductor body at said channel region and is designed so as to present electron-trapping states that generate a negative charge such as to balance, at least in part, said positive interface charge.

In particular, the trapping layer 52, 80 is an insulating layer that has at least an energy level set energetically close (e.g., between 0 eV and 2 eV) to the conduction band of the semiconductor used for manufacturing the devices referred to above.

From an examination of the characteristics of the present disclosure the advantages that it affords are evident.

Finally, it is clear that modifications and variations may be made to what has been described and illustrated herein, without thereby departing from the scope of the present disclosure.

For instance, the present disclosure may be applied to devices based upon a SiC polytype other than 3C—SiC or 4H—SiC, in general transistors and diodes. Furthermore, the present disclosure may be applied to devices based upon a material other than SiC, for example, GaN and AlGaN/GaN (normally-off HEMTs).

In addition, the present disclosure finds applications in a wide range of electronic devices other than the ones described in the aforementioned embodiments, for example, VMOSs (Vertical-channel MOSFETs), DMOSs (Diffused MOSFETs), CMOSs (Complementary MOSFETs).

The present disclosure may moreover find application in horizontal-channel devices, using the trapping layer inside of the insulating layer set in contact with a semiconductor of a P type.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device comprising:
a semiconductor body of silicon carbide, having a first face opposite to a second face, the semiconductor body having positive-charge carriers at the first face;
a first conduction terminal at the first face of the semiconductor body;
a second conduction terminal at the second face of the semiconductor body;
a channel region in said semiconductor body, the channel region configured to house, in use, a flow of electrons between the first conduction terminal and the second conduction terminal; and
a trapping layer, of an amorphous insulating material, in electrical contact with the semiconductor body at the channel region, the trapping layer including a plurality of electron traps; and
an interface between the semiconductor body and the trapping layer, the interface having a positive charge, a plurality of electron traps generating a negative charge to balance, at least in part, the positive interface charge.

2. The electronic device according to claim 1, wherein the trapping layer has an energy level which is energetically close to a conduction band of the semiconductor body.

3. The electronic device according to claim 1, wherein the trapping layer is of an insulating alloy including aluminum.

4. The electronic device according to claim 1, wherein the trapping layer includes $Al_2O_3$.

5. The electronic device according to claim 1, wherein the trapping layer has a thickness comprised between 30 nm and 100 nm.

6. The electronic device according to claim 1, wherein:
said electronic device is a transistor that includes a gate terminal, which extends at the first face of the semiconductor body and includes a gate metallization,
said first conduction terminal is a source terminal of the transistor and said second conduction terminal is a drain terminal of the transistor, and
the trapping layer is a gate oxide arranged between the gate metallization and the first face of the semiconductor body.

7. A diode comprising:
a semiconductor body of silicon carbide, having a first face opposite to a second face, the semiconductor body having positive-charge carriers at the first face;
a first conduction terminal at the first face of the semiconductor body;
a second conduction terminal at the second face of the semiconductor body;
a channel region in the semiconductor body, the channel region configured to house, in use, a flow of electrons between the first conduction terminal and the second conduction terminal; and
a trapping layer in electrical contact with the semiconductor body at the channel region, the trapping layer including a plurality of electron traps;
an interface between the semiconductor body and the trapping layer, the interface having a positive charge, a plurality of electron generating a negative charge to balance, at least in part, the positive interface charge;
an anode terminal which extends at the first face of the semiconductor body;
a cathode terminal which extends at the second face of the semiconductor body; and
a trench which extends in the semiconductor body starting from the first face towards the second face, the trapping layer extending in the trench.

8. The electronic device according to claim 7, wherein:
the anode terminal is a metal layer having a portion that extends in said trench, and
said trapping layer extends between said portion of the anode terminal and the channel region.

9. The electronic device according to claim 7, wherein the diode is a Schottky diode that includes a metal-semiconductor junction formed by an electrical-contact region between the anode terminal and the channel region alongside said trench.

10. A method for manufacturing an electronic device, comprising:
forming a first conduction terminal at a first face of a semiconductor body of silicon carbide opposite to a second face, the semiconductor body presenting positive-charge carriers at the first face, which define a positive interface charge;
forming, at the second face of the semiconductor body, a second conduction terminal, the semiconductor body including a channel region configured to house, in use, a flow of electrons between the first conduction terminal and the second conduction terminal; and
forming a trapping layer, of an amorphous insulating material, in electrical contact with the semiconductor body at the channel region, including forming electron traps that generate a negative charge to balance, at least in part, the positive interface charge.

11. The method according to claim 10, wherein forming the trapping layer includes forming an insulating layer that has at least an energy level set energetically close to a conduction band of the semiconductor body.

12. The method according to claim 10, wherein forming the trapping layer includes depositing an insulating alloy including aluminum.

13. The method according to claim 10, wherein forming the trapping layer includes forming one from among: $Al_2O_3$ $Al_2O_3/HfO_2$, and $SiO_2/Al_2O_3/SiO_2$.

14. The method according to claim 10, wherein forming the trapping layer includes one of the following:
thermal annealing treatment in a reducing environment;
biasing of the trapping layer by a voltage adapted to favor accumulation of electrons in the trapping layer; or
doping of the trapping layer by electro-negative atomic species.

15. An electronic device comprising:
a semiconductor body having a first face and opposite to a second face, the semiconductor body having charge carriers of a first type;
a first conduction terminal at the first face of the semiconductor body;
a second conduction terminal at the second face of the semiconductor body, the semiconductor body is configured to house, in use, a flow of charge carriers between the first conduction terminal and the second conduction terminal; and
a trapping layer, of a negatively doped insulating material, which extends in electrical contact with the semiconductor body, the trapping layer including a plurality of charge traps;
an interface between the semiconductor body and the trapping layer, the interface having charge of a first type, a plurality of charge traps generating a charge of a second type to balance, at least in part, the first interface charge.

16. The electronic device according to claim 15, wherein:
said electronic device is a transistor that includes a gate terminal, which extends at the first face of the semiconductor body and includes a gate metallization,
said first conduction terminal is a source terminal of the transistor and said second conduction terminal is a drain terminal of the transistor, and
the trapping layer is a gate insulator arranged between the gate metallization and the first face of the semiconductor body.

17. The electronic device according to claim 15, wherein said electronic device is a diode and includes:
an anode terminal which extends at the first face of the semiconductor body;
a cathode terminal which extends at the second face of the semiconductor body; and
a trench which extends in the semiconductor body starting from the first face towards the second face, said trapping layer extending in said trench.

18. The electronic device according to claim 17, wherein:
the anode terminal is a metal layer having a portion that extends in said trench, and
said trapping layer extends between said portion of the anode terminal and a channel region of the semiconductor body.

19. The electronic device according to claim 17, wherein the diode is a Schottky diode that includes a metal-semiconductor junction formed by an electrical-contact region between the anode terminal and the channel region alongside said trench.

20. The electronic device according to claim 15, wherein the trapping layer includes an insulating compound that includes aluminum.

* * * * *